United States Patent
Radosavljevic et al.

(10) Patent No.: US 9,615,147 B2
(45) Date of Patent: Apr. 4, 2017

(54) MULTISENSORY METER SYSTEM

(75) Inventors: Dejan Radosavljevic, La Fayette, NY (US); Roger Mavrides, Canton, MA (US)

(73) Assignee: FLIR Systems, Inc., Wilsonville, OR (US)

( * ) Notice: Subject to any disclaimer, the term of this patent is extended or adjusted under 35 U.S.C. 154(b) by 657 days.

(21) Appl. No.: 13/096,469

(22) Filed: Apr. 28, 2011
(Under 37 CFR 1.47)

(65) Prior Publication Data

US 2012/0001768 A1    Jan. 5, 2012

Related U.S. Application Data

(60) Provisional application No. 61/345,395, filed on May 17, 2010.

(51) Int. Cl.
*G08C 15/06* (2006.01)
*H04Q 9/00* (2006.01)
*G01R 22/06* (2006.01)

(52) U.S. Cl.
CPC ............ *H04Q 9/00* (2013.01); *G01R 22/065* (2013.01); *H04Q 2209/25* (2013.01); *H04Q 2209/60* (2013.01)

(58) Field of Classification Search
CPC .... G01R 22/065; H04Q 9/00; H04Q 2209/25; H04Q 2209/065

(Continued)

(56) References Cited

U.S. PATENT DOCUMENTS 3,840,808 A    10/1974    Liebermann
4,079,314 A    3/1978    Jone
(Continued)

FOREIGN PATENT DOCUMENTS

CN    101319938    12/2008
JP    2002232756 A2    8/2002

OTHER PUBLICATIONS

Telos Rev B (Low Power Wireless Sensor Module), Preliminary Datasheet, Moteiv Corporation, Dec. 5, 2004.*

(Continued)

*Primary Examiner* — Quan-Zhen Wang
*Assistant Examiner* — Stephen Burgdorf
(74) *Attorney, Agent, or Firm* — Haynes and Boone, LLP

(57) ABSTRACT

A multisensory meter system is disclosed. The system comprises one main unit and a plurality of remote units. Each remote unit has at least a sensor to measure a physical parameter and wirelessly transmit the measured parameter as a signal to the main unit. The main unit and the remote units have an interface that allows at least one the remote units to be attached to the main unit. When attached, the main unit and the remote unit function as a single meter, and the main unit is capable of receiving signals from the other remote units. In one embodiment, the main unit and the remote units form a mesh network to transmit and receive signals, wherein each remote unit receives signals and transmits said signals. The mesh network may also contain relays. The remote units may measure a number of physical parameters such as relative humidity, temperature, vibration, moisture, electrical current, air speed, voltage and rotational speed. The signals may contain a unique identifier or code, and may be broadcast in unique frequencies.

19 Claims, 8 Drawing Sheets

US 9,615,147 B2
Page 2

(58) Field of Classification Search
USPC .......... 340/870.03, 870.02–870.07; 324/115, 324/149, 76.11; 348/207.11
See application file for complete search history.

(56) References Cited

U.S. PATENT DOCUMENTS

| | | | |
|---|---|---|---|
| 4,259,635 A | 3/1981 | Triplett | |
| 4,317,130 A | 2/1982 | Brown | |
| 4,378,525 A | 3/1983 | Burdick | |
| 4,847,780 A * | 7/1989 | Gilker et al. | 702/64 |
| 4,942,356 A * | 7/1990 | Ellingen et al. | 324/156 |
| 5,032,836 A | 7/1991 | Ono et al. | |
| 5,170,114 A | 12/1992 | Lowenstein et al. | |
| 5,264,795 A | 11/1993 | Rider | |
| 5,319,799 A | 6/1994 | Morita | |
| 5,353,134 A * | 10/1994 | Michel | F41G 3/165 33/262 |
| 5,386,117 A | 1/1995 | Piety et al. | |
| 5,426,360 A | 6/1995 | Maraio et al. | |
| 5,565,783 A | 10/1996 | Lau et al. | |
| 5,612,616 A | 3/1997 | Earle | |
| 5,640,155 A | 6/1997 | Springer | |
| 5,740,214 A | 4/1998 | Rebec et al. | |
| 5,845,009 A * | 12/1998 | Marks et al. | 382/228 |
| 5,946,641 A | 8/1999 | Morys | |
| 6,043,640 A | 3/2000 | Lauby et al. | |
| 6,078,874 A | 6/2000 | Piety et al. | |
| 6,130,519 A | 10/2000 | Whiting et al. | |
| 6,137,285 A | 10/2000 | Walsten et al. | |
| 6,181,244 B1 | 1/2001 | Hall | |
| 6,189,384 B1 | 2/2001 | Piety et al. | |
| 6,220,098 B1 | 4/2001 | Johnson et al. | |
| 6,256,303 B1 | 7/2001 | Drakoulis et al. | |
| 6,366,217 B1 * | 4/2002 | Cunningham et al. | 340/870.31 |
| 6,628,496 B2 | 9/2003 | Montjean | |
| 6,734,658 B1 * | 5/2004 | Bierer | 324/115 |
| 6,975,104 B2 | 12/2005 | Gregorec, Jr. | |
| 7,075,289 B2 | 7/2006 | Chen | |
| 7,142,990 B2 | 11/2006 | Bouse et al. | |
| 7,163,336 B2 | 1/2007 | Blakeley, III | |
| 7,242,173 B2 | 7/2007 | Cavoretto | |
| 7,312,603 B2 | 12/2007 | Luo et al. | |
| 7,327,133 B2 | 2/2008 | Baker et al. | |
| 7,379,981 B2 | 5/2008 | Elliott et al. | |
| 7,439,726 B2 | 10/2008 | Luo et al. | |
| 7,526,966 B2 | 5/2009 | Gysling et al. | |
| 7,659,710 B2 | 2/2010 | Luo et al. | |
| 7,712,669 B2 * | 5/2010 | Mahany et al. | 235/472.02 |
| 7,715,176 B2 | 5/2010 | Perez et al. | |
| 7,725,270 B2 | 5/2010 | Davis | |
| 7,728,275 B2 | 6/2010 | Blanchard | |
| 7,884,598 B2 | 2/2011 | Wang et al. | |
| 2004/0019461 A1 | 1/2004 | Bouse et al. | |
| 2004/0217881 A1 * | 11/2004 | Pedyash et al. | 340/870.07 |
| 2005/0065743 A1 * | 3/2005 | Cumming et al. | 702/62 |
| 2006/0009257 A1 * | 1/2006 | Ku | G01N 33/4972 455/556.1 |
| 2006/0056370 A1 * | 3/2006 | Hancock et al. | 370/338 |
| 2006/0176175 A1 * | 8/2006 | Evans et al. | 340/539.22 |
| 2007/0057814 A1 | 3/2007 | Goldberg et al. | |
| 2007/0159317 A1 * | 7/2007 | Nagata | B60R 1/00 340/461 |
| 2007/0179754 A1 * | 8/2007 | Sper | 702/189 |
| 2007/0276626 A1 | 11/2007 | Bruffey | |
| 2008/0109387 A1 * | 5/2008 | Deaver et al. | 705/412 |
| 2008/0129482 A1 | 6/2008 | Seguchi et al. | |
| 2008/0204361 A1 * | 8/2008 | Scales | F41G 3/165 345/8 |
| 2008/0272932 A1 * | 11/2008 | Booker et al. | 340/854.9 |
| 2009/0016164 A1 * | 1/2009 | Dionysiou | 367/108 |
| 2009/0022362 A1 * | 1/2009 | Gagvani et al. | 382/100 |
| 2009/0184244 A1 * | 7/2009 | Drews | A62B 3/00 250/330 |
| 2009/0201379 A1 * | 8/2009 | Schultz | H04N 5/225 348/207.11 |
| 2009/0261967 A1 * | 10/2009 | Chen | G08B 25/006 340/531 |
| 2009/0300379 A1 * | 12/2009 | Mian et al. | 713/300 |
| 2010/0134094 A1 | 6/2010 | Shah et al. | |
| 2010/0181990 A1 * | 7/2010 | Hudson et al. | 324/115 |
| 2011/0015796 A1 * | 1/2011 | Heydron et al. | 700/286 |
| 2011/0096148 A1 * | 4/2011 | Stratmann | G01J 5/02 348/46 |
| 2011/0221908 A1 * | 9/2011 | Hoelter | B29C 43/36 348/164 |
| 2014/0257058 A1 * | 9/2014 | Clarysse | G06Q 50/22 600/301 |
| 2014/0267768 A1 * | 9/2014 | Burleigh | G01J 5/025 348/165 |
| 2016/0080666 A1 * | 3/2016 | Stuart | H04N 5/332 348/135 |

OTHER PUBLICATIONS

Ideal 660A Clamp Meters w/TightSight Display Instruction Manual, Ideal Industries, Inc., ND4960-5, Mar. 17, 2008.*
Ambreen Ali and Felicia Berlanga. "Linear vs. Constant Envelope Modulation Schemes in Wireless Communication Systems." Introduction to Wireless Communication Systems Textbook. Dec. 1999.
A.R. Hayes et al. "Optical Wireless Communication Using Digital Pulse Interval Modulation." Proceedings of SPIE, vol. 3532, pp. 61-69. Electronics Research Group, United Kingdom. Nov. 1998.
"Digital Modulation in Communications Systems—An Introduction." Application Note 1298. Agilent Technologies. pp. 1-47.
Z. Ghassemlooy et al. "A Synopsis of Modulation Techniques for Wireless Infrared Communication." Optical Communications Research Group, NCRLab., Northumbria University, United Kingdom, 2007.

* cited by examiner

MULTISENSORY METER SYSTEM

CROSS-REFERENCE TO RELATED APPLICATION

The present application claims priority to U.S. provisional patent application No. 61/345,395, entitled "Detachable Clamp-On Meter with Built-In Line Splitter" and filed on May 17, 2010. This priority provisional patent application is incorporated by reference herein in its entirety.

FIELD OF THE INVENTION

This invention generally relates to a metering system comprising multiple sensors deployed remotely from each other and from a main unit. The inventive multisensory meter system can be deployed for multiphase power monitoring and analysis, multi-point air balancing for HVAC applications, routine monitoring and trouble-shooting at industrial complexes, among other home and industrial uses. This invention also generally relates to clamp meters for measuring electrical current and more particularly to a clamp meter with a wireless clamp-on jaw assembly or other wireless sensors, and with or without a built-in line splitter.

BACKGROUND OF THE INVENTION

Positioning remote contact or non-contact sensors to make various measurements and transmitting the measured values, such as light, voltage, current, temperature, sound, motion or continuity, to a receiving unit is known in the patent literature. Remote clamp meter positioned apart from a display unit is also known. Conversely, a removable display for a multi-meter base unit is also known.

Remote, transmitting sensors have also been used in surveying electrical power lines, fluid conduits or machineries. Examples in the electrical power line art include U.S. Pat. No. 5,426,360 to Maraio et al., U.S. Pat. No. 7,715,176 to Perez et al., U.S. Pat. No. 5,565,783 to Lau and U.S. published patent application no. 2002/0075616 to Montjean. Examples in the fluid conduit art include U.S. Pat. No. 7,725,270 to Davis and U.S. Pat. No. 7,526,966 to Gysling et al. Examples in fault detection field for machineries include U.S. published patent application 2004/0019461 to Bouse et al. and U.S. Pat. No. 6,078,874 to Piety et al. Other examples of remote ultrasonic sensors include U.S. Pat. Nos. 6,220,098 to Johnson et al. and 6,189,384 to Piety et al.

However, the prior art lacks a system's approach to collecting data or measurements from remote sensors. For some of the prior art references discussed above, the base units or main units do not have a way to distinguish signals from one sensor from another. Furthermore, the devices of the prior art do not show the ability for the remote sensors to be attached to the main unit to become a single integral hand-held unit and to be used as such.

SUMMARY OF THE INVENTION

One embodiment the invention comprises a multisensory meter system having at least one main unit and a plurality of remote units. Each remote unit has at least a sensor to measure a physical parameter and wirelessly transmit the measured parameter as a signal to the main unit. The main unit and the remote units comprise an interface that allows at least one the remote units to be attached to the main unit. The main unit and the attached remote unit can function as a single meter and the main unit is capable of receiving signals from the other remote units while being attached to a remote unit. The main unit and the remote units along with optional relays may form a mesh network.

Another embodiment of the invention comprises a measuring system having a meter device and at least one wireless sensor connectable to the meter device. The wireless sensor measures a physical parameter and wirelessly transmits the physical parameter to the meter device. When the wireless sensor is connected to the meter device the wireless sensor is connected to the meter device by a physical electrical path and the meter device comprises an adaptor to process the signal from the wireless sensor to the meter device. In one embodiment, the wireless sensor is a wireless clamp-on current meter and the adaptor is a high-pass filter.

BRIEF DESCRIPTION OF THE DRAWINGS

In the accompanying drawings, which form a part of the specification and are to be read in conjunction therewith and in which like reference numerals are used to indicate like parts in the various views.

DETAILED DESCRIPTION OF THE PREFERRED EMBODIMENTS

Figure 1A:
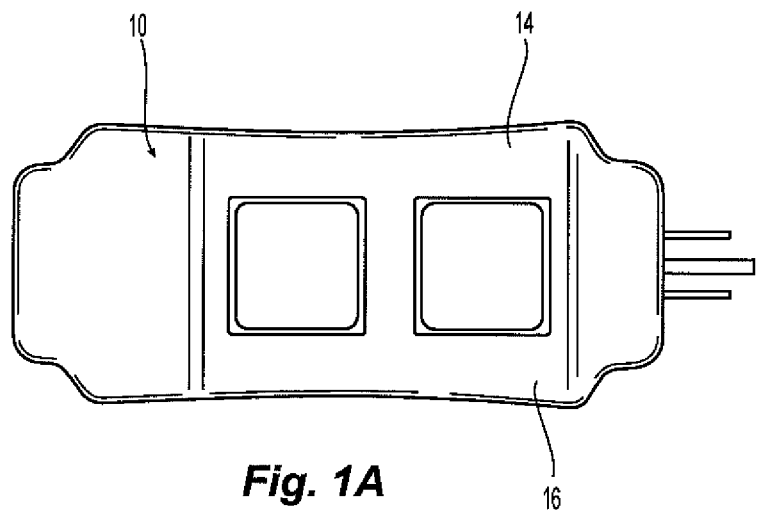
FIG. 1A is a top view of a conventional line splitter and FIG. 1B is a perspective view of the line splitter of FIG. 1A with a conventional clamp meter.

Clamp meters are devices that measure the electrical current through a wire. To get a reading, the clamp meter is clamped around either the current carrying wire or the neutral AC power wire. Most appliances use two- or three-conductor power cord. If the clamp-on jaw of the clamp meter is attached to such cord, measuring the current is problematic because the two fields produced by the current carrying wire and neutral current carrying wires are 180° out of phase thereby canceling each other out. To resolve this issue, electricians typically use a patch power cord with loose AC wires enabling them to clamp onto either the current carrying wires or the neutral wires. Commercial line splitters, pluggable to an electrical outlet and capable of separating multi-conductor AC power cable into individual lines, are available, such as AC Line Splitter 480172 (Extech Instruments Corp. of Waltham, Mass., a subsidiary of FLIR Systems, Inc. of Wilsonville, Oreg.). Referring to FIGS. 1A and B, a conventional line splitter 10 is used to electrically separate the conductors inside a multi-conductor AC power cable. The conductors in power cord 12 of an appliance, when plugged into the proximal end of line splitter 10, are connected to either branch 14 or 16. Clamp meter 20 can then be clamped around one of the two branches 14, 16 to measure the current in said branch. On some commercially available line splitters, such as the Extech model shown in FIG. 1A, the user can also measure voltage by placing the test leads connected to the clamp meter's input sockets to the Voltage Test sockets of the line splitter. Optionally, multiple current test openings each having a different gain are provided in the line splitter, as seen in FIG. 1A.

In certain applications, the clamp meter is clamped onto a cable in very tight or otherwise inaccessible locations, making it difficult for the operator to see the display, or in some instances the location is hazardous while power is applied. In order to make measurement in these situations, the operator would have to work in awkward positions or unsafe locations to view the display. In addition, for some real-time measurements, such as measuring start-up currents or detecting variable current loading, the clamp meter should be kept in place during the measurement.

Figure 2A:
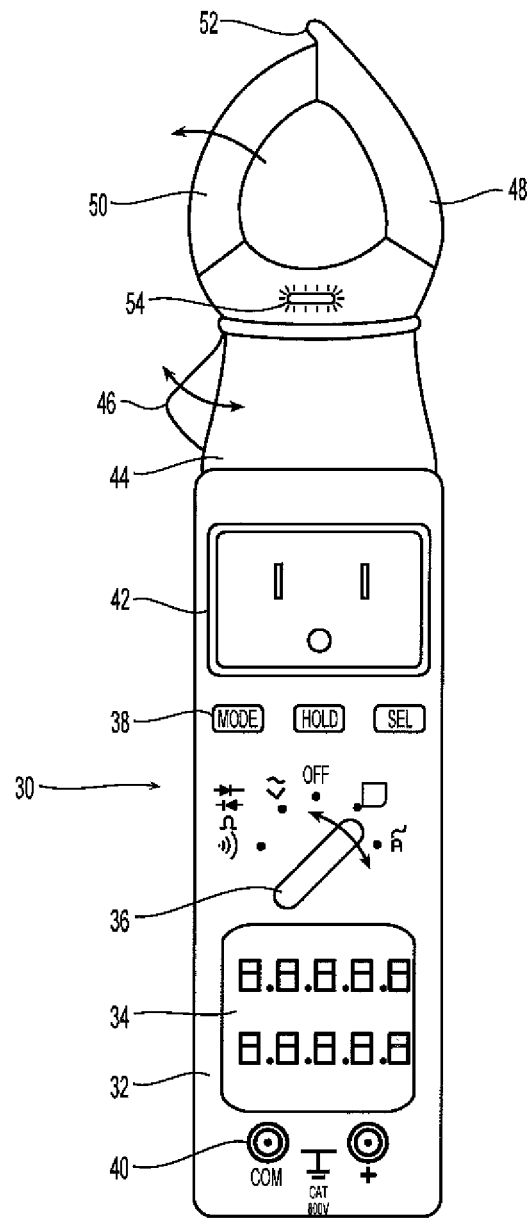
FIG. 2A is a top view of a preferred embodiment of the meter device of the present invention with a clamp-on jaw attached thereto.
Figure 2B:
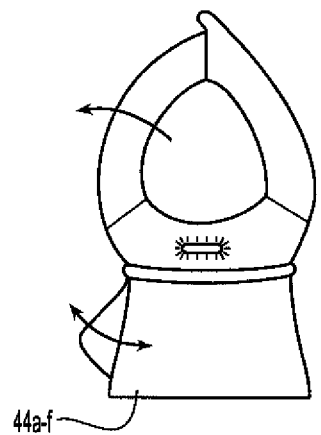
FIG. 2B is a view of untethered or unattached clamp-on jaws or sensors.
Figure 3A:
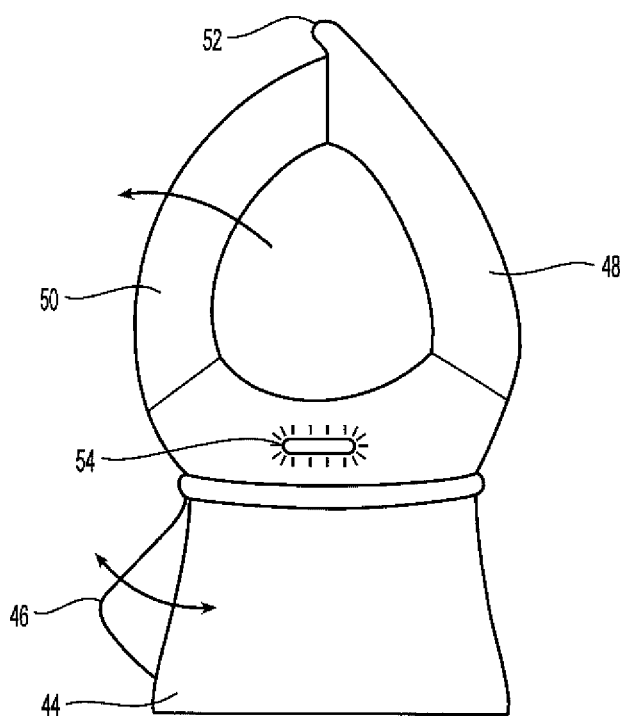
FIGS. 3A and 3B are top and end views of the wireless clamp-on jaw embodiment of the wireless sensors shown in FIGS. 2A and 2B.
Figure 3B:
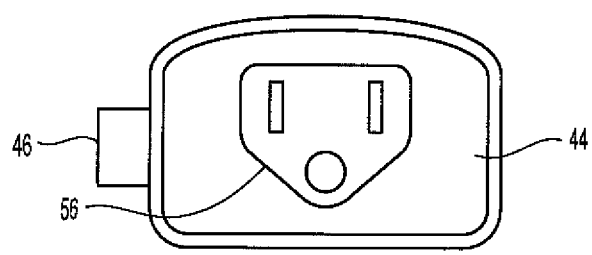
Figure 4:
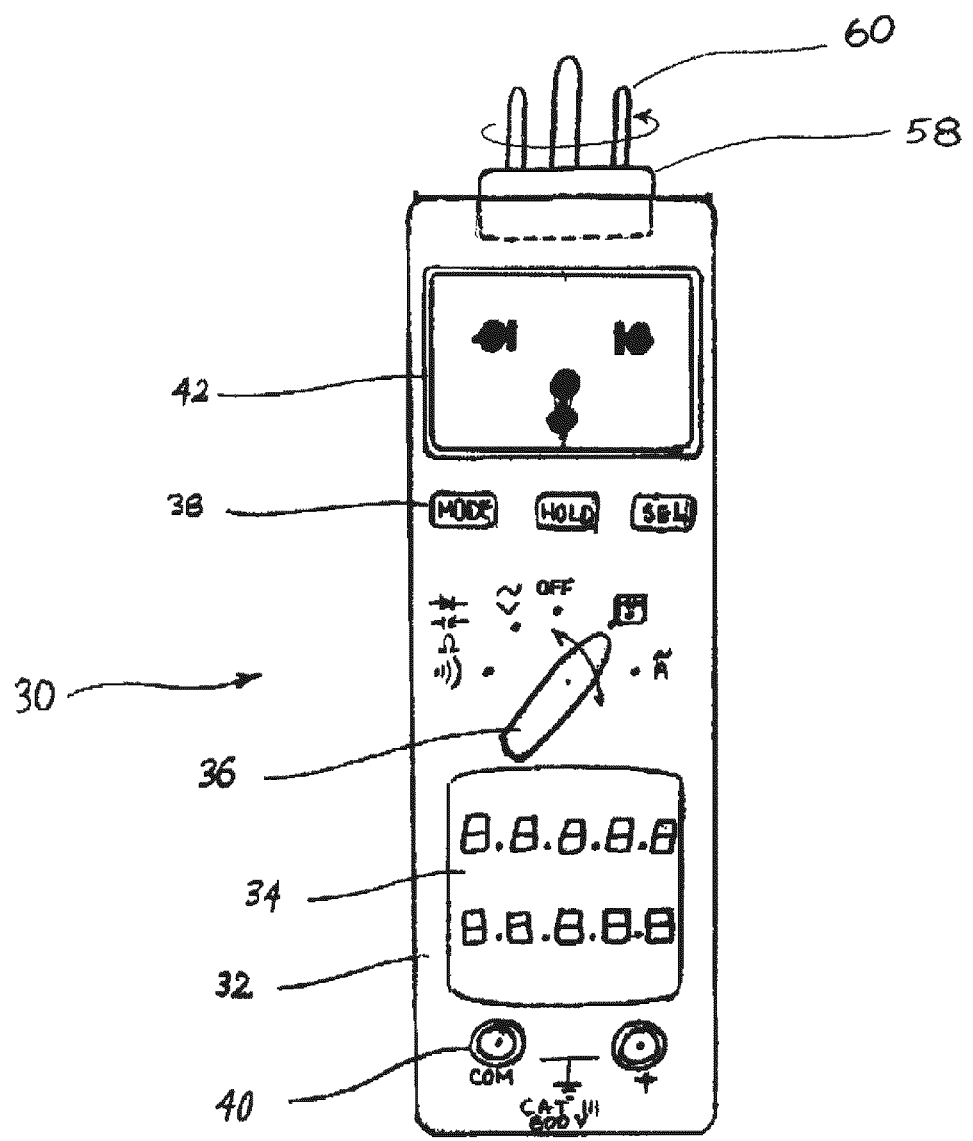
FIG. 4 is a top view of the meter device separated from the wireless clamp-on jaw or wireless sensor.

One embodiment of the present invention is an improved measuring system including an improve clamp meter, where a wireless sensor 44a-f including a clamp-on jaw 44, illustrated in FIGS. 2B, 3A and 3B, can be connected or be detached from a meter device 30 or a main body, shown in FIGS. 2A and 4. When unconnected to or untethered from meter device 30, clamp-on jaw 44 or wireless sensor 44a-f wirelessly transmits its signal to meter device 30, which may incorporate a line splitter into the body of meter device 30. The wireless clamp-on jaw 44 or sensor 44a-f is/are releasably attached to the body of meter device 30. Meter device 30 itself can be plugged into an AC outlet and an appliance's plug can be plugged into the built in line splitter which enables both current and/or voltage to be displayed on the meter device, as discussed further below.

In yet another aspect of the invention, the clamp meter is capable of rotating up to 180° while it is plugged into an AC outlet. Additionally, the wireless sensor or clamp-on jaw has a built-in wireless transmitter and the meter body has a built-in wireless receiver. The wireless sensor or clamp-on jaw, in addition to the built-in radio transmitter preferably has circuitry to convert the current field to a known value and send it serially (in a digital format via the AC plug connector) and wireless/remotely to a CPU circuit in the body of the meter device.

When clamp-on jaw 44 or wireless sensor 44a-f is attached to the body of the meter device 30, the signal of the current value is AC-coupled (using an adaptor such as a high-pass filter design) through the AC plug leads to the CPU on the main circuit board, and the CPU then sends the measured value to the display. When the clamp-on jaw/wireless sensor and meter device are connected to each other, the transmitter in the clamp-on jaw and the receiver on the main PCB in the body of the meter device are preferably turned off to conserve power. When the clamp-on jaw is disconnected, the transmitter is preferably turned on automatically and broadcasts the current related data to the meter device. Subsequently, the built-in receiver inside the meter device is also turned on and receives the transmitted signal. The signal is then sent to the built-in CPU and subsequently to the display. The wireless, untethered clamp-on jaw feature provides the operator with more options to position the clamp-on jaw in an awkward spot, hard to see, or otherwise hazardous locations. The meter device can then be transferred to a safe area to view the measured values.

Figure 1B:
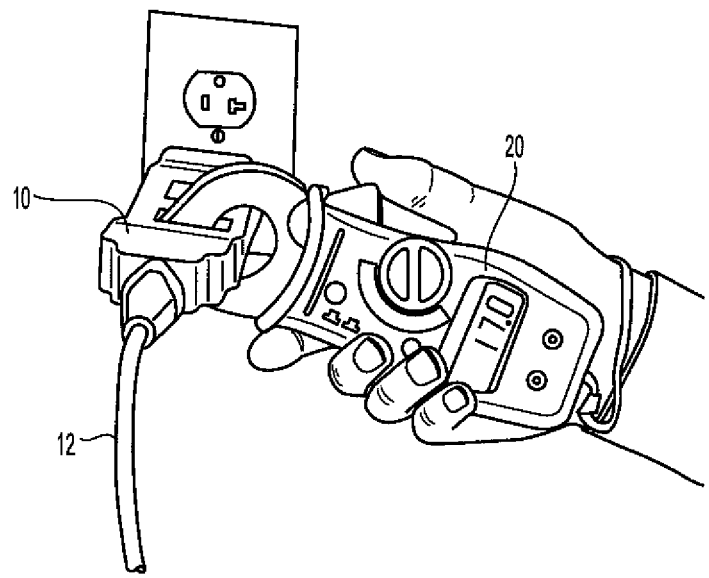

FIG. 2A illustrates a top view of one preferred embodiment of the meter device 30 of the present invention. Device 30 comprises an elongated housing 32, digital display 34 for displaying measured values, such as current and voltage simultaneously, rotary selector knob or dial 36 to select a variety of functions with various ranges, and pushbuttons 38 to perform further selection of parameters or functions. Two or more combinations of input jacks 40 can be used with optional test leads (not shown) to input optional multi-meter signals. A built-in universal AC power receptacle 42 is provided to receive an electrical wire such as wire 12 shown in FIG. 1B of an electrical appliance (not shown).

Detachable wireless clamp 44 is releasably attached to housing 32 of meter device 30. Preferably, clamp 44 is untethered to housing 32 and has its own power source, such as a primary battery, rechargeable battery or solar panels. Extending from the top of clamp 44 is a pair of rigid clamp jaws 48, 50 as best shown in FIGS. 2A and 3A. At least one of the jaws is pivotally mounted. Movable jaw 50 is preferably spring-biased to a closed position against fixed jaw 48. The outer surface of the jaws has an arcuate shape, and the ends of the outer surfaces may be slightly offset to form a tip 52 at the end of the fixed jaw 48. Tip 52 allows manipulation of electrical wires. Inside the jaws are electrical coils (not shown) which are connected to appropriate circuitry in the housing for detecting electrical properties of a wire or conductor placed within the jaws. The internal circuitry displays the selected parameters on the digital display 34. Preferably, a built-in radio transmitter (not shown) is provided inside clamp 44 and measuring circuitry (not shown) can also be located within clamp 44 to convert the measured value into voltage or current. An analog-to-digital converter to convert the analog signals to digital and send it serially and wirelessly/remotely to a built in radio receiver (not shown) located in the CPU circuit (not shown) inside housing 32 of device 30. Non-contact voltage (NCV) LED indicator 54 is mounted on the front surface of clamp 44 in order to determine the existence of live current. If AC voltage is present, the NCV LED light will turn on with a steady light. The NCV sensor is hidden inside tip 52 and therefore tip 52 is used to test the existence of live wires.

Referring now to FIGS. 3A and B, when clamp 44 is detached it may be switched on/off or may be designed to immediately turn on its transmitter and broadcasts the current data, e.g., at a FCC approved RF frequency to the built-in data receiver (not shown) inside meter device 30. The receiver would then send the signal to the built-in CPU (not shown) and on to digital display 54. Clamp 44 has female AC plug 56 adapted to mate with male AC plug 60, as shown in FIG. 4. Plugs 56 and 60 electrically connect clamp 44 to housing 32, when clamp 44 is plugged into meter device 30. When connected, the data is transmitted via plugs 56 and 60 using an optional high-pass filter design (not shown). The signal transmitter in the clamp and the receiver inside housing 32 of the meter device will both turn off when clamp 44 and meter device 30 are connected to conserve power.

Referring to FIG. 4, meter device 30 also includes a line splitter function, which is operable when clamp 44 is disconnected from housing 32. Wire 12 of an appliance is plugged into receptacle 42 and male plug 60 is plugged into a wall socket. AC current and/or voltage flowing through housing 32 is/are measured and displayed on display 34.

As recommended by manufacturers and electricians, US outlets should be installed with the ground pin up, however a large percentage of installation are done with the ground pin down. This poses a problem when reading the display; therefore the housing is designed to allow the clamp body to rotate 180° allowing the operator to rotate the display so that it is visible. Hence, male plug 60 can be mounted on a swiveling element 58 with a 180° rotation capability to enable an operator to turn meter device 30 so that the digital display is more convenient to read. Swiveling element 58 can alternatively be positioned immediately above display 34, e.g., between display 34 and knob 36, so that only display 34 is rotatable for easy viewing. Alternatively, a second display 34 can be provided on the opposite side of the first display so that the operator can read the measured parameters without rotating the meter device.

In accordance with another aspect of the present invention and as illustrated in FIG. 2B, a plurality of clamp-on jaws 44 can be utilized. Each clamp-on jaw is preferably detachable and untethered to the meter device 30. Preferably, each clamp-on jaw 44 reads a different parameter or variable. For example, first clamp-on jaw could be reading phase 1 of a circuit, a second clamp-on jaw reading Phase 2 and a third clamp-on jaw reading Phase 3. Or each clamp-on jaw could be reading different circuits. An alternative version, meter device 30 shown in FIG. 4 would be able to accept wireless signals from wireless sensors measuring moisture, humidity, pressure, air velocity, vibration, battery capacity, distance and other environmental and electrical signals, including a multimeter. In this case the meter operates as a multifunctional meter, wherein a particular function is selected prior to deployment. The present invention is not limited to any particular number of clamp-on jaws or the function(s) of each clamp meter or wireless sensors. Each clamp-on jaw or wireless sensor can be deployed to a remote or hard-to-reach location, where it measures the desired parameter or variable and wirelessly transmits, via Bluetooth or other wireless modes of transmission, the data back to meter device 30 where the data can be viewed or processed prior to viewing. In other words, each detachable, untethered clamp-on jaw has a remote transmitter and the meter device 30 has at least one receiver to receive signals sent by the clamp meter(s).

In another embodiment, each detachable, untethered clamp-on jaw and wireless sensor 44a-f has a unique, specific code that it transmits to meter device 30, so that the meter device can recognize and pair the received signals with the corresponding clamp meter. In one example, more than one of clamp-on jaw 44a-f can measure current at different locations in an electrical scene, and due to the transmitted unique codes meter device 30 can distinguish the received signals to display the current readings at different locations. Meter device 30 can also use the received signals, e.g., current, voltage and frequency at one location, to calculate the power, i.e., amperage*voltage, to monitor the power fluctuations at that location. In a HVAC application, meter device 30 and detachable, untethered clamp-on jaws and wireless sensors 44a-f can be used to measure electrical current, air flow sensors, air pressure, humidity, vibration, moisture, battery capacity, distance, etc.

In accordance to another aspect of the present invention, the electrical circuitry and processor(s) needed to process the raw data sensed by clamp meter(s) 44a-f can be located in the individual clamp-on jaws or wireless sensors or in the body of meter device 30. In this situation, meter device 30 acts similar to a "mothership" for the detachable, untethered clamp-on jaws or wireless sensors 44a-44f to dock, and when clamp meters 44a-f are deployed meter device 30 receives, processes and/or displays signals transmitted by the clamp-on jaws or wireless sensors. Alternatively, meter device 30 also contains a wireless or wired transmitter to transmit the raw signals received from clamp meter(s) or wireless sensor(s) 44a-44f or processed signals based on these raw signals to a computing or display device, such as a monitor or a computer or an infrared thermal camera.

In another embodiment, the present invention provides a multisensory meter system which comprises a main unit and a plurality of remote units. Each remote unit preferably contains at least one sensor and preferably detects at least one physical parameter, such as relative humidity, temperature, vibration, moisture, electrical current, air speed, voltage, rotational speed, among other things. Alternatively, one or more remote units are capable of measuring multiple parameters. In other words, one or more remote units can itself be a multisensory meter. Each remote unit is capable of being connected serially by wires, such as electrical wires, co-axial cables, telephone-type wires/jacks or fiber optical cables, to the main unit, or being wirelessly connected to the main unit via Bluetooth, infrared communication, radio frequency (RF or RFID), among others.

The main unit is capable of processing the information, data or measurements from all the remote units selectively or simultaneously without any input from the technician. Preferably, it has the circuitry or circuitries necessary to process the various pre-processed or raw data received from the remote units. Alternatively, the remote units transmit data in a standard format that is readable by the main unit. In other words, each remote unit measures and processes the desired parameters locally and then transmits the desired parameters in a wireless packet or signal to the main unit. Preferably, the remote units digitize the signal before transmitting it to the main unit. In one example, each remote unit comprises a high-frequency transmitter connected to the sensor and measuring/processing components. The transmitter modulates the measurement into a modulated signal and the main unit demodulates the signal before displaying or processing the information. In a preferred embodiment, all remote units modulate their signals in a similar fashion, such that the main unit can demodulate and read signals from all or substantially all the remote units.

The modulation and demodulation process may follow any standardized method, or the modulation and demodulation process may be unique or proprietary to protect the inventive multisensory meter system from unauthorized access. Alternatively, the transmitted signals from the remote units are encrypted or are password-protected, and the main unit has the corresponding decryption or password to authenticate the signals.

Preferably, each remote unit also transmits with the signals a unique identifier or code to the main unit, so that the main unit can recognize and match the signals to the correct transmitting remote unit and to process the signal properly. In other words, with the unique identifier or code the main unit would know whether the received signal relates to temperature, voltage, vibration, etc. and which remote unit had transmitted the signal. As discussed below, the unique identifier or code could be the transmitting frequency of the remote unit.

Preferably, the main unit can perform the functions described above and below with or without user input. The main unit also comprises a display that can exhibit any and all of the measurements transmitted from the remote units. Additionally, the main unit further has the capacity to process the received signals into more useful information, as discussed in the parent application. For example, the main unit may calculate the power consumption of a machine or device by processing the current, voltage and frequency of the machine or device. In a HVAC application, the main unit can process and display air flow, humidity, vibration, moisture of a building or room.

Figure 5:
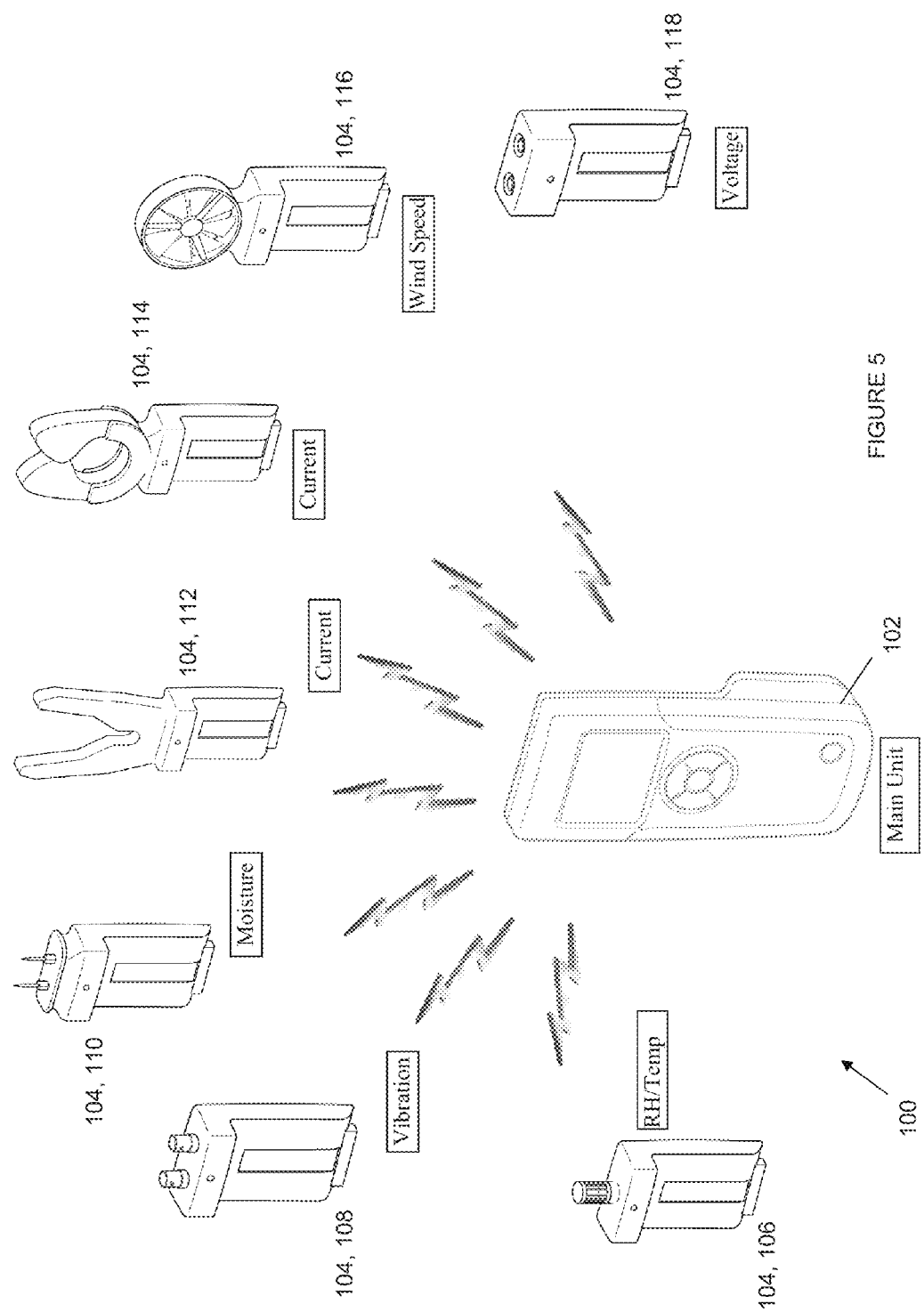
FIG. 5 is a schematic representation of another embodiment of a multisensory meter system of the present invention.

An exemplary multisensory meter system 100 is illustrated in FIG. 5. Multisensory meter system 100 comprises at least one main unit 102 and a plurality of remote units, referring generally as elements 104. Remote units 104 can individually perform a sensing and/or measuring function, and a single remote unit 104 may perform multiple sensing/measuring functions. Remote unit 104 may measure relative humidity (RH) and temperature (with an IR pyrometer) shown as element 106 and discussed in U.S. Pat. No. 7,168,316 to Blakely and U.S. published patent application 2008/0259993 to Blakeley; vibration and acceleration shown as element 108 such as Extech 407850, 407860 and 461880 meters available from Extech Instrument Corp., moisture shown as element 110 and discussed in U.S. published patent application 2008/0259993 to Blakeley; electrical current shown as element 112 and discussed in U.S. Pat. No. 7,056,012 to Blakeley; electrical current (clamp meter) shown as element 114 and discussed in the parent/priority application; wind speed (anemometer) shown as element 116 and discussed in U.S. Pat. No. 7,452,127 to Blakeley; and electrical voltage shown as element 118 and discussed in U.S. Pat. No. 7,056,012 to Blakeley.

Remote units 104 may include other sensor(s) such as tachometer discussed in U.S. Pat. No. 7,111,981 to Blakeley, or a digital multi-function meter discussed in U.S. Pat. No. 7,056,012 to Blakeley. Each remote unit 104 may include an IR temperature sensor as discussed in the Blakeley patents and patent applications or a conventional temperature sensor such as thermocouples or thermistors. The Blakeley references are incorporated herein by reference in their entireties. The present invention is not limited to any measuring capability or combinations thereof.

As discussed above, remote units 104 can be connected to main unit 102 by wires (not shown) or by wireless connection, as shown in FIG. 5. In order to wirelessly communicate with each other, remote units 104 should be positioned within a relatively short distance from main unit 102 so that the attenuation of the wireless signal can be minimized. Also, physical (walls, rocks, trees or the likes) or electronic (frequency interference or the likes) obstructions may also interfere with the transmission and reception of the signals between remote units 104 and main unit 102. This can limit the geographical range of multisensory meter system 100

Figure 6:
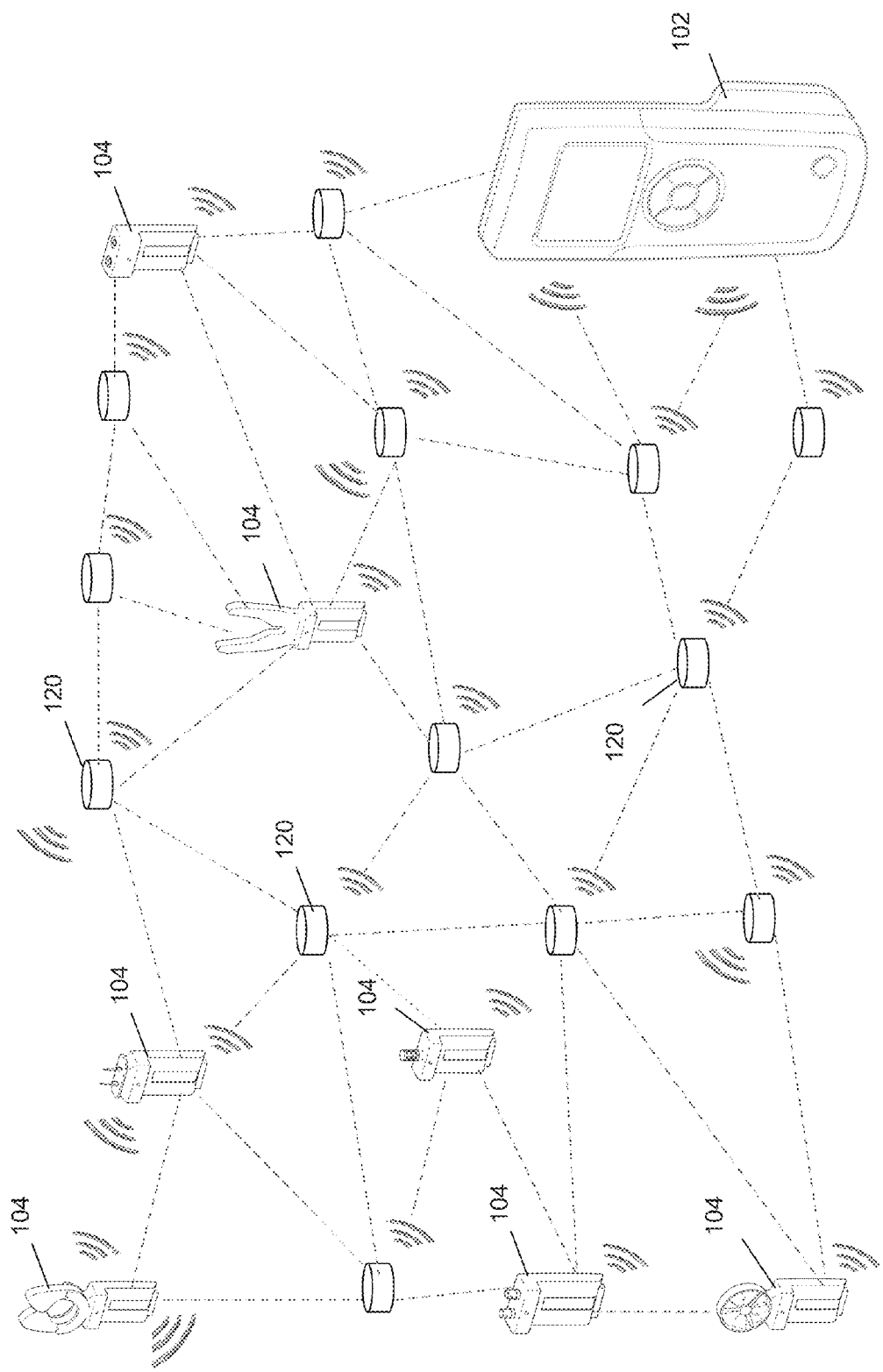
FIG. 6 is a schematic representation of another embodiment of a mesh link system usable with the multisensory meter system of present invention.

In accordance with another aspect of the present invention, multisensory meter system 100 can be deployed in a mesh network, as shown in FIG. 6. A mesh network generally comprises a system of nodes, which can be main unit(s) 102, remote units 104 and relays 120. In this embodiment, each main unit, remote unit or relay has the ability to receive and transmit wireless signals. Relays 120 can simply receives a signal and transmits the same signal, or relays 120 may also perform computations and calculations depending on the applications. Preferably, relays 120 only receive and transmit to keep their size manageable. Alternatively, relays 120 can be omitted and remote units 104 and main unit(s) 102 can serve as the nodes of the link network.

As best shown in FIG. 6, if one or more nodes or if a plurality of the nodes fail, signals from remote units 104 can still reach main unit 102, due to the multiple direct and indirect (or zig-zag) pathways available to the signals. Also, although only adjacent connections among the nodes are shown with broken lines, direct connections between non-adjacent nodes are also available. The nodes can also be re-positioned or moved during a deployment, so long as the nodes are within the ranges of each other. Furthermore, an irregular shape mesh network, e.g., an L-shape or S-shape, linear or curvilinear plane, 2-D or 3-D shape, can be used. Known mesh networks include WLAN mesh network and networks constructed according to IEEE 802.11 standards and its variations.

In another embodiment, as illustrated in FIGS. 5 and 6 in addition to receiving information main unit 102 can also transmit instructions to remote units 104 to perform a particular job or function. In yet another embodiment, one or more remote units 104 can perform the functions of main unit 102. An advantage of this embodiment is that if main unit 102 fails due to a malfunction or is destroyed by an unanticipated event, measurements are preserved. It will be noted that not all remote units 104 shown in FIGS. 5 and 6 are connected to or are parts of the mesh network. In other words, one or more remote units 104 may function normally but do not form a part of the mesh network.

In a preferred embodiment, each remote unit 104 converts the measurements obtained by the sensor(s) contained therein into a digital stream or bit digital stream suitable for wireless or wired communication. The digital stream may contain complex or compressed data. Additionally, each digital stream may contain a unique identifier or code to identify the origin of the digital stream to main unit 102 or another receiving remote unit 104. Moreover, each digital stream may include a time stamp with the date and time to indicate when the measurements were taken. An advantage of including the time stamp is that since one measurement may arrive at main unit 102 or another receiving remote unit 104 multiple times due to the numerous pathways available, main unit 102 may use the time stamp to discard duplicate data. Alternatively, main unit 102 can place the time stamp on digital stream when received.

Another way for main unit 102 to distinguish data from remote units 104 is by multiplexing. Any known multiplexing methods can be used. An exemplary multiplexing technique is to (i) select a range, preferably a narrow range, of frequencies for main unit 102 to sweep through, (ii) assign each remote unit 104 a unique or dedicated narrow band or operating frequency within said narrow sweeping range, and (iii) transmit and receiving the digital stream at the dedicated frequencies. For example, main unit 102 sweeps through a frequency range from $\lambda_1$ to $\lambda_2$, where this frequency range $(\lambda_2-\lambda_1)$ can be about 1000 Hz, and each remote unit 104 is assigned a band of about 10 Hz at $\lambda i+5$ Hz, where i represents a unique frequency within the range $\lambda_1$-$\lambda_2$ and where i=1 to n, where n is the number of remote units 104 deployed. The actual frequency range and frequency bands can be adjusted depending on the actual application.

One advantage of this frequency sweeping is that measured parameters from remote units 104 can be displayed automatically at the same time or serially on the display of the main unit 102 without input from the technician.

In another embodiment, main unit 102 may be replaced by a smartphone, a cellular phone, a computer or a computer tablet.

Main unit 102 and remote units 104, as well as relays 120 can be powered by batteries, solar panels, electrical powered converted from radio frequency (RF) energy, or any known power source. These elements can be positioned by any known method, including but not limited to, attaching to tripods, extension poles or retractable/telescopic poles also known as boom, strings/ropes or suspended from ceilings and walls.

Figure 7A:
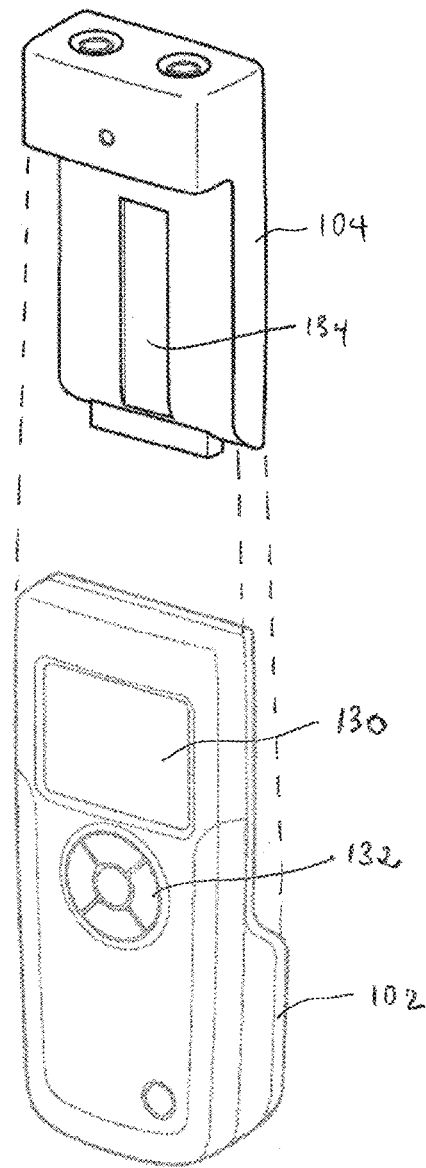
FIG. 7A is an exploded view showing a handheld integral unit comprising a main unit and a remote unit.
Figure 7B:
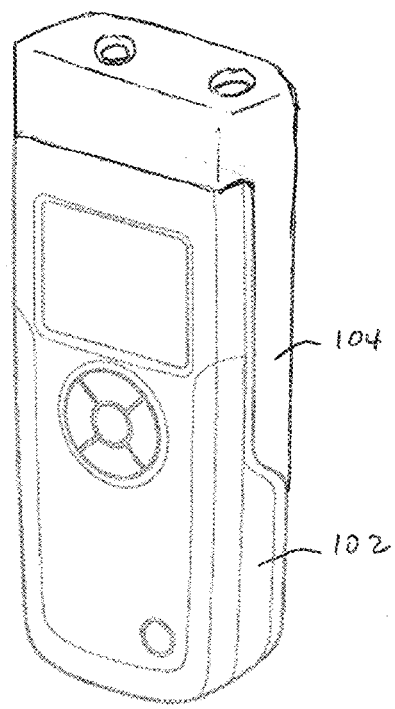
FIG. 7B is a perspective view of an assembled integral unit shown in FIG. 7A.

Another embodiment of the present invention is illustrated in FIGS. 7A and 7B. One or more remote unit 104 can be attached to main unit 102 to form a single or integral handheld sensor unit. This allows multisensory meter system 100 the flexibility and versatility to become multiple handheld sensor units to handle any situations in the field. In one example, while the multisensory meter system 100 is deployed in the field as shown in FIG. 5 or 6 to diagnose an anomaly, if the technician suspects a moisture problem he/she can connect moisture meter 110 to main unit 102 to investigate any surface of interest. Main unit 102 may continue to collect data from the other remote units 104 while the technician investigates the moisture of surfaces of interest. Main unit preferably has LCD display 130 to display the measured parameters and buttons 132 to allow control and navigation by the technician. Main unit 102 and remote units 104 preferably have mechanical and electrical interfaces 134 that allow this connection. Remote units 104 may continue to communicate wirelessly with main unit 102 while being attached thereto. Alternatively, when connected remote units 104 may be connected to main unit 102 by AC-coupling using an adaptor such as a high-pass filter.

Figure 8:
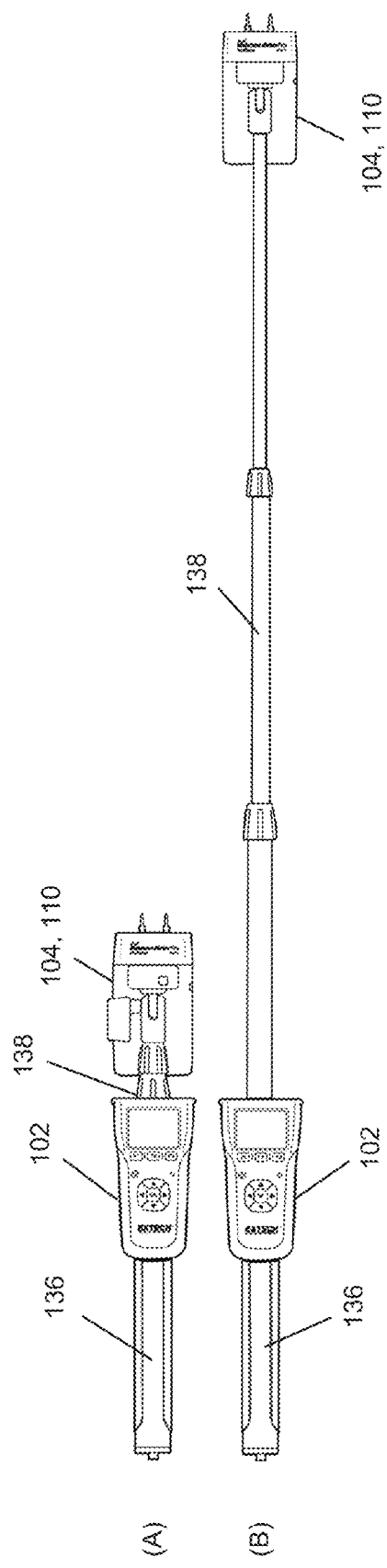
FIG. 8A is a top view of a main unit connected to a remote unit by an extension pole.
FIG. 8B is a top view of the embodiment of FIG. 8A with the extension pole extended.

Another embodiment is shown in FIGS. 8A and 8B, where main unit 102 has handle 136 and is connected to remote unit 104 via extension pole 138. Extension pole 138 conveniently, telescopically extends as shown in FIG. 8B to deploy remote unit 104 at a location of interest. Extension pole 138 can be extended to any lengths, e.g., four or fifteen feet. As shown, remote unit 14 is a moisture meter 110, but can be any of the meters disclosed herein or any meter known in the art. In one application, the embodiment shown in FIGS. 8A and 8B is used with an IR camera, such as those available from FLIR Systems, Inc. of Wilsonville, Oreg., including but not limited to the I-series or e-series IR cameras. IR cameras are capable of capturing a thermal scene and identify cold or hot areas. For cold areas, IR cameras cannot distinguish whether the coldness is caused by cold air penetration or by wetness. Moisture remote unit 104, 110 can identify whether the source of coldness is caused by wetness and quantify the degree of wetness. As described above, main unit 102 can wirelessly transmit the measured wetness value to an IR camera and the IR camera can utilize the wetness measurement in its calculation and reports. Moisture remote unit 110 may include pin-type sensors shown in FIG. 8B and pin-less type sensors. One or more IR cameras can be a part of the mesh network shown in FIG. 6.

As discussed above, moisture remote units 110 can also be attached to walls, ceilings or other surfaces to wirelessly transmit measurements to main unit 102. In this application, a building inspector or contractor can monitor multiple moisture readings at once to compare and determine the relative wetness in a structure or home. In the embodiment shown in FIGS. 8A and 8B, remote unit(s) 104 can be transmit signals wirelessly to main unit 102 or through an electrical wire connecting them. The wire can be positioned next to or within extension pole 138.

In another application, borescope cameras, such as those available from FLIR Systems including but not limited to HDV600 or HDV630 wireless articulated borescope, BRD10, BR100, BR200 and BR250, can be used with main unit 102 and remote unit(s) 104. The borescope camera can be positioned at one location where damages, e.g., leaking pipes, molds and mildew, are suspected. The inspector or contractor can operate the main unit 102 and moisture sensor 110 in a different location, e.g., in a room below a leak or on the opposite side of a wet/cold wall. The borescope can wirelessly transmit a video picture to the suspected damaged areas to main unit 102 and display same to the inspector or contractor. This would streamline and accelerate their diagnoses of the problem(s). One or more borescope cameras can be a part of the mesh network shown in FIG. 6.

While it is apparent that the illustrative embodiments of the invention disclosed herein fulfill the objectives stated above, it is appreciated that numerous modifications and other embodiments may be devised by those skilled in the art. One possible modification is that the signals transmitted by the remote units can be analog, as well as digital. Another possible modification is that the remote units 104 may have their sensing functions turned off to function as relays 120. Moreover, one or more features of one embodiment can be used in any other embodiments. Therefore, it will be understood that the appended claims are intended to cover all such modifications and embodiments, which would come within the spirit and scope of the present invention.

What is claimed is:

1. A multisensory meter system comprising a main unit, a plurality of attachable remote units, and an infrared (IR) camera, wherein:
   each attachable remote unit comprises:
      a sensor configured to measure a physical parameter,
      a transmitter configured to wirelessly transmit the measured parameter over a respective wireless signal to the main unit, and
      a mechanical interface that allows the attachable remote unit to releasably attach to the main unit;
   the main unit and any one of the attachable remote units are configured to form an integral handheld meter while releasably attached to each other;
   the main unit is configured to:
      receive the measured parameter over a corresponding wireless signal from any one of the attachable remote units;
      process the measured parameter received from any of the attachable remote units; and
      wirelessly transmit the measured parameter to the camera; and
   the IR camera comprises a display and is configured to:
      capture an image of a scene;
      receive the measured parameter wirelessly from the main unit or any one of the attachable remote units; and
      process the captured image based on the measured parameter and/or display the captured image and the measured parameter on the display,
   wherein the IR camera is separate from the main unit and the attachable remote units;
   the plurality of attachable remote units comprise at least one attachable remote unit comprising a different type of sensor than any other of the attachable remote units; and
   each attachable remote unit is configured to transmit its respective wireless signal with a unique identifier or code that identifies at least a type of the measured parameter.

2. The multisensory meter system of claim 1, wherein the main unit and the attachable remote units form a mesh network to transmit and receive signals, wherein each attachable remote unit is configured to receive signals from the other attachable remote units and transmit said received signals.

3. The multisensory meter system of claim 2, wherein the mesh network further comprises at least one relay configured to receive and transmit signals.

4. The multisensory meter system of claim 2, wherein the signals are encrypted.

5. The multisensory meter system of claim 1, wherein the measured parameter is selected from a group consisting of relative humidity, temperature, vibration, moisture, electrical current, air speed, voltage and rotational speed.

6. The multisensory meter system of claim 1, wherein the measured parameters are transmitted as digital data over the wireless signals.

7. The multisensory meter system of claim 1, wherein the main unit and the attachable remote units further comprise electrical interfaces configured to provide a physical electrical path between the main unit and an attached one of the attachable remote units while the main unit and the attached one of the attachable remote units are releasably attached to form the integral handheld meter, and wherein the main unit comprises an adaptor to process an electrical signal received from the attached one of the attachable remote units via the electrical path.

8. The multisensory meter system of claim 7, wherein the physical electrical path comprises an AC-coupling.

9. The multisensory meter system of claim 8, wherein the adaptor comprises a high-pass filter.

10. The multisensory meter system of claim 1, wherein the attachable remote units comprise a clamp-on jaw adapted to measure an electrical current.

11. The multisensory meter system of claim 10, wherein the main unit comprises an electrical line splitter.

12. The multisensory meter system of claim 1, wherein at least one of the attachable remote units is configured to measure at least one of the following physical parameters: moisture, humidity, pressure, air velocity, vibration, battery capacity, distance, current, or voltage.

13. The multisensory meter system of claim 1, wherein the main unit further comprises a central processing unit and a display.

14. The multisensory meter system of claim 1, wherein the main unit further comprises a transmitter.

15. The multisensory meter system of claim 1, wherein at least one of the attachable remote units comprises a moisture meter.

16. The multisensory meter system of claim 1, further comprising an extension pole, wherein the main unit and any one of the attachable remote units are configured to be releasably attached to each other via the extension pole, and wherein the extension pole extends to space an attached one of the attachable remote units from the main unit to measure the physical parameter.

17. The multisensory meter system of claim 1, wherein:
the one or more attachable remote units comprise a plurality of attachable remote units; and
the main unit is configured to multiplex the respective wireless signals from the plurality of attachable remote units.

18. The multisensory meter system of claim 1, wherein the unique identifier or code associated with each attachable remote unit comprises a unique transmitting frequency.

19. The multisensory meter system of claim 1, wherein the IR camera is configured to capture the image of the scene prior to receiving the measured parameter.

* * * * *